(12) United States Patent
Alkan

(10) Patent No.: US 8,125,299 B2
(45) Date of Patent: Feb. 28, 2012

(54) FILTER CIRCUIT

(75) Inventor: Erdogan Alkan, Fayetteville, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 410 days.

(21) Appl. No.: 12/501,041

(22) Filed: Jul. 10, 2009

(65) Prior Publication Data

US 2011/0010749 A1     Jan. 13, 2011

(51) Int. Cl.
*H03H 7/01* (2006.01)

(52) U.S. Cl. .......................... 333/175; 333/185

(58) Field of Classification Search ............ 333/175, 333/167, 172, 174, 176, 185
See application file for complete search history.

(56) References Cited

U.S. PATENT DOCUMENTS

| | | | |
|---|---|---|---|
| 5,255,318 A | 10/1993 | Gurusami et al. | |
| 5,793,265 A | 8/1998 | Spielman | |
| 6,380,826 B1 | 4/2002 | Palinkas | |
| 6,476,688 B2 | 11/2002 | Palinkas | |
| 6,684,065 B2 | 1/2004 | Bult et al. | |
| 6,734,767 B2 | 5/2004 | Vanoverschelde et al. | |
| 6,784,760 B2 | 8/2004 | Olcen et al. | |
| 6,794,957 B2 | 9/2004 | Shafer et al. | |
| 7,026,904 B2 | 4/2006 | Gomez et al. | |
| 7,076,226 B2 | 7/2006 | Bult et al. | |
| 7,095,454 B2 | 8/2006 | Waight et al. | |
| 7,126,443 B2 | 10/2006 | De Bhailis et al. | |
| 7,259,639 B2 | 8/2007 | DeBhailis et al. | |
| 7,423,608 B2 | 9/2008 | Dunn et al. | |
| 7,423,699 B2 | 9/2008 | Vorenkamp et al. | |
| 7,508,284 B2 | 3/2009 | Shafer | |
| 7,515,895 B2 | 4/2009 | Vorenkamp et al. | |
| 7,528,788 B2 | 5/2009 | Dunn et al. | |
| 2006/0031911 A1 | 2/2006 | Shafer et al. | |
| 2006/0229046 A1 | 10/2006 | Bult et al. | |
| 2008/0157898 A1 | 7/2008 | Palinkas et al. | |
| 2008/0174925 A1 | 7/2008 | Woo et al. | |
| 2008/0224798 A1 | 9/2008 | Shafer | |
| 2008/0303610 A1 | 12/2008 | Zennamo, Jr. et al. | |
| 2009/0073949 A1 | 3/2009 | Malak et al. | |

FOREIGN PATENT DOCUMENTS

EP    1484773 A1    12/2004

*Primary Examiner* — Stephen Jones

(74) *Attorney, Agent, or Firm* — Schmeiser Olsen & Watts

(57) ABSTRACT

A filter for use in a coaxial cable network includes a printed circuit board having first and second opposed major surfaces, and first and second opposing sides. The opposed major surfaces are substantially parallel to a single plane, and are bisected by a longitudinal axis. The first and second opposing sides are substantially parallel to the longitudinal axis. The filter further includes an input terminal and an output terminal connected to the printed circuit board. The input terminal and the output terminal have an axis extending substantially parallel to the longitudinal axis. A signal path is disposed on the printed circuit board and extends from the input terminal toward the output terminal. The filter further includes a plurality of resonator elements fabricated upon the first opposed major surface. In one embodiment, the inductor elements are arranged in series along the signal path defining a footprint of less than 540 square millimeters. The filter passes a first range of frequencies in a provider bandwidth and attenuates a second range of frequencies in a personal data network bandwidth. In one embodiment, the resonator elements are parallel inductor elements and capacitor elements, the inductor elements being etched spiral inductors.

38 Claims, 9 Drawing Sheets

FILTER CIRCUIT

FIELD OF THE INVENTION

The present invention relates generally to electronic filter assemblies used in the cable television (CATV) industry, and more specifically to a filter assembly that prevents personal data network signals from passing outside a user's network.

BACKGROUND OF THE INVENTION

A typical cable television ("CATV") network includes a head end facility from which a plurality of feeder cable lines emanate. The feeder cable lines branch off at a tap having ports. A cable drop, which may be a single coaxial cable, extends from each port to a respective user. The cable television system is a two-way communication system. A downstream bandwidth carries signals from the head end to a user and an upstream bandwidth carries upstream signals from a user to the head end.

One example of such a system is a bidirectional CATV system with a head end controlled by a system operator and with a plurality of user's televisions equipped with set top boxes or cable modems. Downstream bandwidth of the CATV system may include broadcast television channels, video on demand services, internet data, home security services, and voice over internet (VOIP) services. Upstream bandwidth may include data related to video on demand, internet access, or other services provided by the system operator. In one possible configuration, the upstream and downstream bandwidths are transmitted between the head end and the tap via optical fiber, and between the tap and the user via coaxial cable. Upstream and downstream bandwidths are typically transmitted via oscillatory electrical signals propagated along the cable lines in a discrete frequency range, or channel. Downstream bandwidth frequencies typically range from 54-1002 megahertz (MHz), and upstream bandwidth frequencies typically range from 5-42 MHz.

A personal data network may be coupled to the cable television network via coaxial cable. Often, the personal data network is a home entertainment network providing multiple streams of high definition video and entertainment. In one example, the personal data network may employ technology standards developed by the Multimedia over Coax Alliance (MoCA). The MoCA standards promote networking of personal data utilizing the existing coaxial cable that is wired throughout the user premises. MoCA technology provides the backbone for personal data networks of multiple wired and wireless products including voice, data, security, home heating/cooling, and video technologies. In such an arrangement, the cable drop from the cable system operator connects to a MoCA-certified device such as a broadband router.

The underlying technology behind the MoCA standard is utilization of orthogonal frequency-division multiplexing (OFDM) modulation, which is a modulation method wherein a large number of closely-spaced orthogonal sub-carriers are used to carry data. The signals are generated with the exact minimum frequency spacing needed to make them orthogonal so that they do not interfere with each other. The data is divided into several parallel data streams or channels, one for each sub-carrier. Each sub-carrier is modulated with a conventional modulation scheme (such as quadrature amplitude modulation or phase shift keying) at a low symbol rate. In this manner, OFDM may be likened to using many slowly-modulated narrowband signals rather than one rapidly-modulated wideband signal. One advantage of OFDM is that problems such as attenuation of high frequencies in a long copper wire are alleviated without complex equalization filters.

A MoCA-certified device such as the broadband router interconnects other MoCA-certified components located within the premises, for example additional set top boxes, routers and gateways, bridges, optical network terminals, personal computers, and gaming systems. The personal data network allows distribution and sharing of entertainment content among the MoCA-connected devices. For example, a high definition program recorded on a set top box in the living room may be played back by a second set top box located in a bedroom. And, a high definition movie recorded on a camcorder and stored on a user's personal computer may be accessed and displayed through any of the set top boxes within the premises. The personal data network may also allow high-definition gaming between rooms.

The personal data network may utilize an open spectrum bandwidth on the coaxial cable to transmit the personal data content, such as entertainment content. For example, a cable system operator may utilize a bandwidth of frequencies up to 1002 MHz, and a satellite system operator may utilize a bandwidth of frequencies from 1550-2450 MHz. The unused range of frequencies, or open spectrum bandwidth, is 1125-1525 MHz. In another example, the open spectrum bandwidth may higher than 2450 MHz. A personal data network utilizing the open spectrum bandwidth does not interfere with any of the bandwidth being utilized by the cable television services provider or a satellite services provider.

As may be appreciated, a personal data network utilizing coaxial cable must be able to pass signals backwards through a splitter in order to properly transmit the content room-to-room. Coaxial splitters are essentially directional couplers designed to isolate splitter outputs and prevent signals from flowing room-to-room or outlet-to-outlet. The isolation is needed to reduce interference from other devices and maximize the power transfer from the point of entry to the outlets, so as to achieve the best television reception.

The MoCA standard has been specifically designed to allow signals to travel backward through splitters, termed insertion, and pass from splitter output to output, termed isolation. All coaxial outlets in a house may be reached from each other by a single isolation jump and a number of insertion jumps.

One problem with this arrangement is that, unless preventive measures are taken, the content on the personal data bandwidth may also pass through the coaxial cable drop and potentially to other users or subscribers on the cable television network.

SUMMARY OF THE INVENTION

According to an embodiment of the invention, a filter circuit assembly includes a printed circuit board having first and second opposed major surfaces and first and second opposing sides. The opposed major surfaces are substantially parallel to a single plane and are bisected by a longitudinal axis. The first and second opposing sides are substantially parallel to the longitudinal axis. The filter circuit assembly includes an input terminal connected to the printed circuit board, the input terminal having an axis extending substantially parallel to the longitudinal axis. The filter circuit assembly further includes an output terminal connected to the printed circuit board, the output terminal having an axis extending substantially parallel to the longitudinal axis. A signal path disposed on the printed circuit board extends from the input terminal toward the output terminal. A plurality of resonator elements are fabricated upon at least one of the major surfaces. The resonator elements are arranged in series along the signal path and define a footprint being less than 540 square millimeters. The filter passes a first range of frequencies in a provider bandwidth and attenuates a second range of frequencies in a personal data network bandwidth.

BRIEF DESCRIPTION OF THE DRAWINGS

The novel features that are characteristic of the preferred embodiment of the invention are set forth with particularity in the claims. The invention itself may be best be understood, with respect to its organization and method of operation, with reference to the following description taken in connection with the accompanying drawings in which:

DETAILED DESCRIPTION OF THE PREFERRED EMBODIMENT

Figure 1:
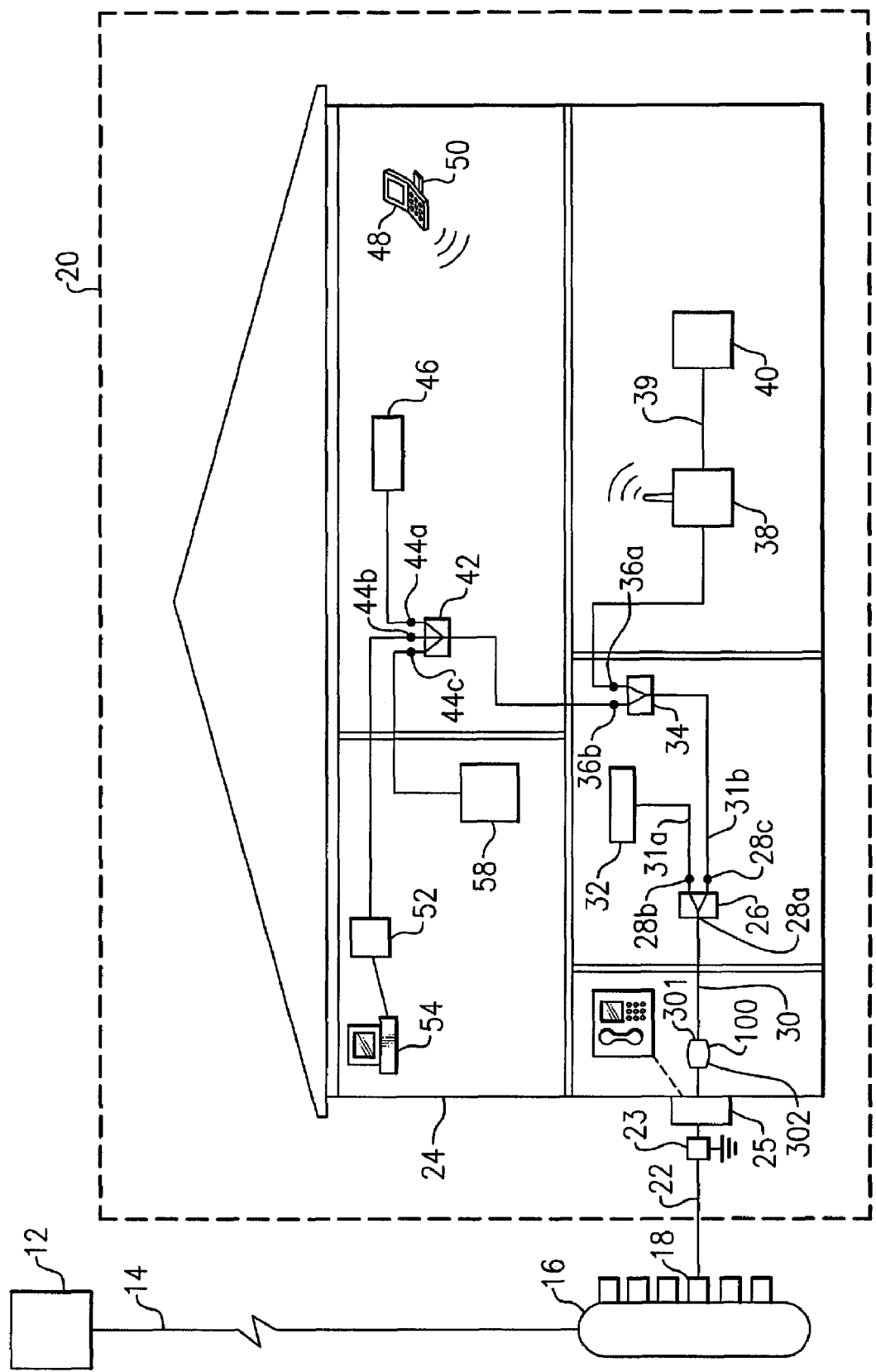
FIG. 1 is a schematic view of a user premises having a cable television network and a personal data network, according to one embodiment of the invention.

Referring to the simple schematic of FIG. 1, a portion of a CATV or cable television network includes a head end facility 12 for processing and distributing signals over the network. Typically the head end facility 12 is controlled by a system operator and includes electronic equipment to receive and re-transmit video and other signals over the local cable infrastructure. One or more main distribution lines 14 carry the signals from the head end facility 12 to a tap 16 configured to serve a local distribution network of about 100 to 250 end users or subscribers. The tap 16 includes a plurality of tap ports 18 which are configured to carry the downstream bandwidth to a user's drop system 20 via a cable drop 22, which may be a single coaxial cable.

The cable drop 22 connects to a ground block 23, which is typically the first device encountered within the drop system 20. The ground block 23 is a device generally placed on the outside of a premises 24 between the cable drop 22 and the internal coaxial wiring of a home, and provides an electrical ground to the drop system 20 by bonding the outer shield of the coaxial cable to the electrical ground of the premises. The ground block 23 may be secured by solid copper to either a cold water pipe or to the ground of the electrical service drop.

In some cable television networks, the distribution line 14 and the cable drop 22 are fiber optic lines. In some drop systems 20, then, an optical network terminal 25 is connected in series to the ground block 23 to convert the fiber optic downstream bandwidth to electrical signals to be carried by coaxial cable.

In one example personal data network, the optical network terminal 25 includes integrated MoCA technology allowing the MoCA platform to govern the personal data network within the premises. In the illustrated example the optical network terminal 25 is located outside the premises (e.g., fixed to the outside of a house), but it may also be located within the premises.

A coaxial cable 30 connects the ground block 23 to a first splitter 26 located within the premises 24. In the disclosed embodiment, the first splitter 26 is a two-way splitter having an input 28a and two distribution ports 28b and 28c. Coaxial cable 31a connects port 28b to a first set top box 32. The first set top box 32 incorporates MoCA technology so as to be included in the personal data network. Port 28c is shown connected via coaxial cable 31b to a second splitter 34. The second signal splitter 34 is illustrated as a two-way splitter having two distribution ports 36a and 36b. Port 36a connects to a wireless broadband router 38. The router 38 is wired via Ethernet cable 39 to a personal computer 40 having gaming software installed thereupon.

Port 36b is connected via coaxial cable to a third splitter 42 having distribution ports 44a, 44b, and 44c. Port 44a connects to a second set top box 46 that also includes MoCA technology. Port 44b of the splitter 42 connects to a cable modem 52, which is in turn connected to a desktop personal computer 54 via Ethernet cable. Port 44c connects to a third set top box 58 that also includes MoCA technology. Also shown is a laptop computer 48 having a wireless link to the broadband router 38. The laptop computer 48 includes a MoCA-enabled broadband wireless adapter 50 that plugs into the laptop's USB port.

In the disclosed example, the router 38 includes a MoCA chipset to serve as the platform for the personal data network. The MoCA-enabled router permits the distribution of high quality multimedia content and high-speed data with throughput exceeding 100 megabits per second (Mbps). For example, in the illustrated MoCA-enabled personal data network of FIG. 1, a high definition program recorded on the set top box 32 may be viewed through a television connected to set top box 58. And, a game stored on the personal computer 54 may be played simultaneously through laptop 48.

As mentioned hereinabove, the MoCA standard has been specifically designed to allow signals to travel backward through splitters. One problem with this arrangement is that the content on the personal data bandwidth may also pass to other users or subscribers on the cable television network. For example, entertainment content being passed from the first set top box 32 backwards through first splitter 26 en route to the second set top box 58 may potentially also travel along coaxial cable 30, through tap port 18, and along the distribution line 14.

Another problem with the MoCA arrangement is that the coaxial cable will also carry personal data from other users on the CATV network. Those signals will pass from the distribution line 14 to the user drop system 20. For example, a neighbor may purchase MoCA-enabled products and set up a personal data network within their home. Unless precautions are taken, personal data carried within the MoCA bandwidth will pass back to the distribution line 14.

The inventor has determined that the problems associated with personal data content passing through the drop system 20 may be mitigated by including a low pass filter circuit 100 in the drop system 20. In the illustrated example, the low pass filter circuit 100 is placed before the input 28a of the first splitter 26, in front of any MoCA-enabled devices. In another example, the low pass filter circuit 100 is integrated within the circuitry of the optical network terminal 25. In yet another example, the low pass filter circuit 100 is integrated within the circuitry of the ground block 23.

The filter circuit 100 is designed to pass the cable television bandwidth, but reject or attenuate the personal data network bandwidth. In one example, the MoCA standard specifies passing a bandwidth having a range of frequencies from 5 to 1002 MHz, and rejecting, or attenuating, a bandwidth having a range of frequencies from 1125 to 1525 MHz. In this manner, personal data in the 1125 to 1525 MHz frequency range will be prevented from entering or leaving the user drop system 20.

Figure 2:
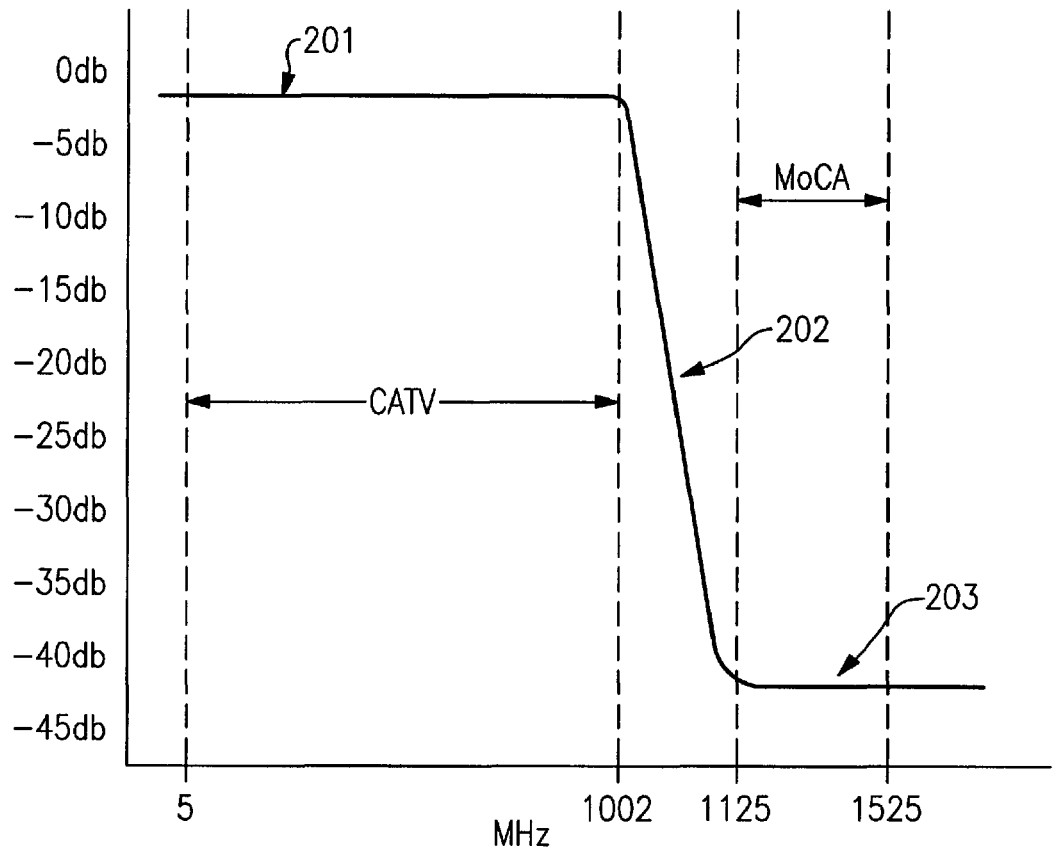
FIG. 2 is a chart showing the desired frequency response of a low pass filter operating in the personal data network of FIG. 1.

Referring to FIG. 2 of the drawings, there is shown a plot of the desired insertion loss as a function of frequency for one example MoCA filter application. The vertical axis represents insertion loss in decibels (dB). The horizontal axis represents bandwidth from 5 MHz to 1525 MHz. A low pass portion 201 signifies the passband frequency range which, in the illustrated example, is below 1002 MHz, the bandwidth of the cable television spectrum (labeled as CATV). A transition portion 202 exists between 1002 MHz and 1125 MHz. Of note is the relatively narrow bandwidth of the transition portion 202 required by the MoCA specification. An attenuating portion of the bandwidth 203 shows flat attenuation of approximately 40 dB from 1125 MHz to 1525 MHz which, in one example, is the bandwidth of the personal data network spectrum (labeled as MoCA).

In another embodiment, the filter circuit 100 may be adapted to pass satellite service provider bandwidth and reject the personal data network bandwidth. In one example, personal data in the 1125 to 1525 MHz frequency range will be prevented from entering or leaving the user drop system 20, and satellite service provider bandwidth in the 1550 to 2450 MHz range will pass. The filter circuit 100 may also be adapted to operate as a band stop filter, in which both CATV bandwidth and satellite bandwidth are allowed to pass, but the personal data network bandwidth in between the two is attenuated. Other frequency ranges are possible depending upon the specific provider bandwidth (e.g., CATV and/or satellite).

An exemplary first step in the design of the low pass filter to meet the requirements of the MoCA specification is to obtain the number of orders for the filter and the topology. This step may be completed using theoretical calculations (e.g., by hand) or using design synthesis software. In one example, Genesys circuit simulation software available through Agilent Technologies (formerly Eagleware) is utilized to arrive at the low pass MoCA filter schematic shown in FIG. 3. The software estimated the topology as a $9^{th}$ order Chebyshev elliptic minimum inductor filter to meet the stringent transition portion 202 of the MoCA specification. Other topologies may be equally operable but may require additional components to implement. For example, other topologies may include a Chebyshev elliptic minimum capacitor filter, a Butterworth filter, or a Bessel filter. In addition, other filter design simulation software may be utilized, such as Ansoft Designer, Advanced Design System (ADS) by Agilent Technologies, or Microwave Office by AWR Corp.

Figure 3:
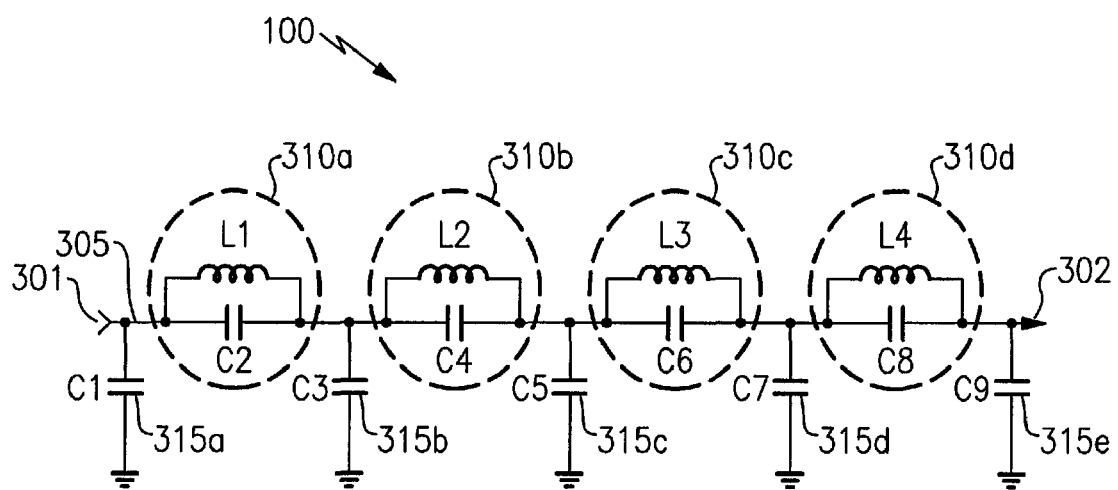
FIG. 3 is a circuit diagram, in schematic form, of a filter according to an embodiment of the invention.

Referring now to FIGS. 1 and 3, a circuit diagram of the filter circuit 100 for an embodiment of the present invention includes a signal path 305 extending from an input 301 to an output 302. In one example, the input 301 is connected to a user-side port within the drop system 20, such as the single port on the first splitter 26. The input 301 may be adapted to receive unfiltered signals comprising the entire cable television bandwidth, the personal data network bandwidth, noise, and any other signals present on the coaxial cable. The output 302 may be in electrical communication with a supplier-side port such as the tap port 18. Conversely, the input 301 may be connected to the supplier-side port and the output 302 may be connected to the user-side port. Further, the filter circuit 100 may be adapted to filter signals in both directions (e.g., bi-directional), so the physical location of the input 301 and output 302 may be arbitrary.

The signal path 305 includes a conductor, such as the center conductor in a coaxial cable, to carry the upstream bandwidth, the downstream bandwidth, and the personal data network bandwidth. The signal path 305 further includes a ground, such as the outer sheath of the coaxial cable 30 that provides a path to ground with various cable connector devices.

The filter circuit 100 further includes a plurality of resonator elements 310a-310d which, in one embodiment, comprise parallel inductor/capacitor (LC) arrangements L1/C2, L2/C4, L3/C6, and L4/C8, respectively. Capacitive shunts 316A-315e are disposed along the signal path 305 and are in electrical communication with the ground. Capacitive shunts 316B, 315c, and 315d are disposed between the resonator elements 310a-310d, respectively. The arrangement of resonator elements 310 and shunt capacitor elements 315 collectively form a minimum inductance elliptic function filter that meets the signal response requirements from the MoCA specification, as depicted in FIG. 2. In one embodiment, the filter circuit 100 may be a $9^{th}$ order Chebyshev elliptic minimum inductor filter.

Once the topology and number of orders has been determined for the filter circuit 100, an exemplary second step in the filter design is to design the individual inductor elements (e.g., L1-L4) and obtain insertion loss and return loss response using the circuit simulation software. Once completed, an exemplary third step in the design process is to model the entire circuit board with inductors, capacitors and the like and conduct a simulated response of the circuit using three-dimensional electromagnetic simulation (3-D EM) software, such as CST Microwave Studio by Computer Simulation Technology, Ansoft HFSS, or Sonnet Suites by Sonnet Software, Inc. The 3-D EM software is more accurate than the circuit simulation software and allows the designer to fine-tune the circuit board elements to achieve the proper signal response.

One obstacle encountered in designing the filter circuit 100 of the present invention was that the "low pass" bandwidth was very broad (e.g., from DC up to approximately 1000 MHz), and the attenuation bandwidth was very high (e.g., between approximately 1125 MHz and 1500 MHz). Prior art low pass filters typically passed a range of frequencies much lower and narrower, for example from 5 MHz to 40 MHz, and attenuated frequencies above 54 MHz. As a result of the very broad bandwidth in the present application, conventional surface-mount inductor elements meeting the design criteria were physically large, and needed relatively large spacing to achieve proper resonant characteristics. In other words, in order to minimize coupling effects the surface-mount inductor elements needed to be spaced such that the finished circuit board was quite large: approximately three inches long and one inch wide. This sizing was much too large to practically fit in a coaxial cable connector.

One solution to this problem was to design the inductor elements L1 thru L4 as etched inductor elements, etched or metalized directly into the printed circuit board. However, etched inductor elements are open structures, generating magnetic and electrical fields, which travel through air and cross through conductive traces of adjacent inductor elements, thereby modifying their individual inductances. Modification of the individual inductance values alters the performance of the resonator elements 310. For example, referring to FIG. 3, the magnetic and electrical fields generated by inductor L1 changes the inductance value of L2, which changes the characteristics of resonator element 310b, and to a lesser but not insignificant extent, the characteristics of resonator elements 310c and 310d. This coupling action may significantly and adversely affect the performance of the filter. In prior art filter designs, compensating for the coupling affects has been necessary.

One means of compensating for coupling effects is to use surface-mounted inductors (e.g., wire-wound) that may be tuned to achieve desired characteristics. As mentioned hereinabove, that option was not feasible in the present invention due to the resulting large-area circuit board.

Figure 4:
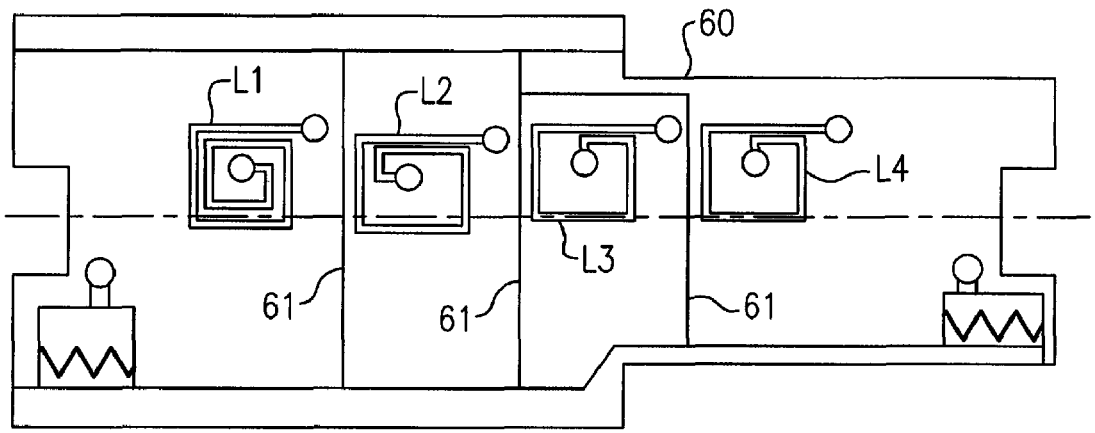
FIG. 4 is a bottom plan view of a circuit board for the circuit diagram of FIG. 3.

Another means of compensating for coupling effects is to add one or more decoupling elements in proximity to the inductors. Referring to FIG. 4, one early design of the filter of the present invention includes a printed circuit board 60 having opposite, planar surfaces. Shown is the surface to which inductors L1-L4 are etched. The initial design includes decoupling elements 61 disposed between the inductors L1-L4. In the disclosed example, the decoupling element 61 is a thin metal strip etched into the board 60.

Figure 5A:
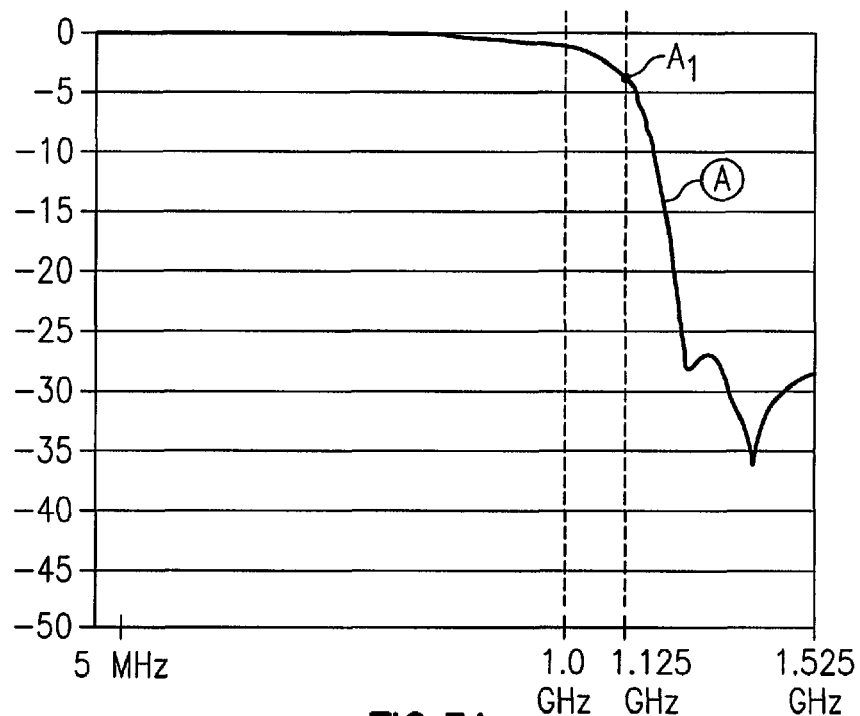
FIGS. 5A and 5B are charts showing the insertion loss and return loss, respectively, of the filter circuit of FIG. 4.
Figure 5B:
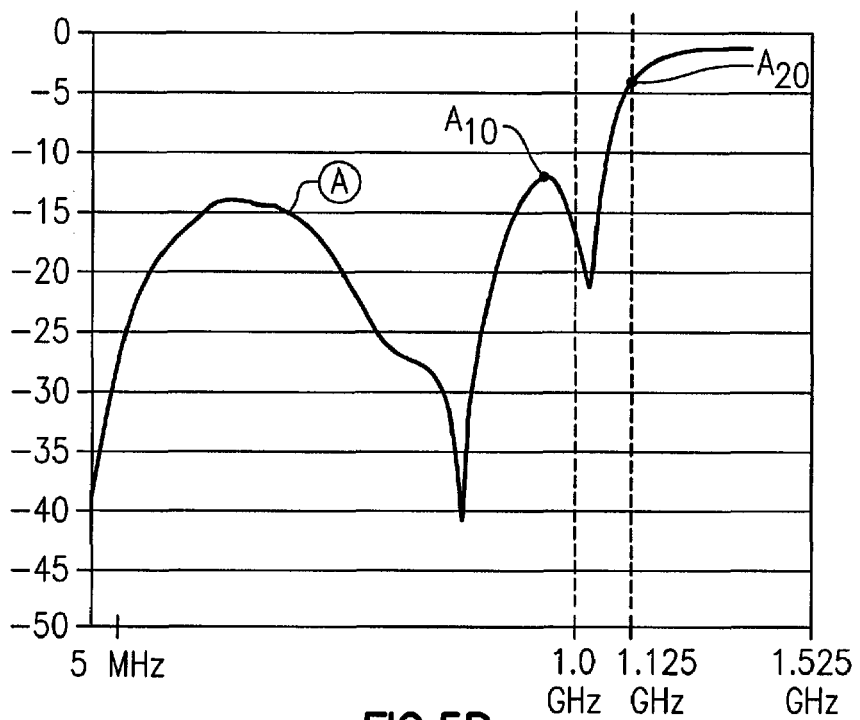

Although inductors L1-L4 were designed to produce the inductance values required by the filter circuit 100 illustrated in FIG. 3, the simulated response of the circuit using 3-D EM software was strikingly different from the goal illustrated in FIG. 2. Referring now to FIG. 5A, the insertion loss of the filter 100 with the decoupling element 61 is shown as trace A. The signal response shows no attenuation from 5 MHz to 1002 MHz, but the transition to the attenuated portion is gradual, such that the insertion loss at 1125 MHz (point $A_1$) is about 4 dB. Clearly, this value is far off the design goal of 30 dB. Similarly, trace A of FIG. 5B illustrates the simulated return loss signal with the decoupling element 61. Point $A_{10}$ shows an unacceptable return loss of approximately 12 dB, which is less than the goal of 15 dB in the pass bandwidth.

Despite arduous attempts by the inventor to reconfigure the location of the decoupling elements 61, a suitable frequency response was not attained. Although the reason for this failure is not understood with certainty, it is believed that the decoupling element 61 causes significant signal parasitic or fringe capacitance, which, in turn, causes significant deterioration of the filter's 100 ability to pass signals having a frequency of up to 1000 MHz while attenuating frequencies greater than 1125 MHz. Accordingly, parasitic or fringe capacitance that could be tolerated in low pass filters operating at frequencies below 54 MHz could no longer be tolerated in low pass filters operating up to the 1000 MHz threshold. With this insight, the inventor removed the decoupling element 61, counter to common practice.

Figure 6A:
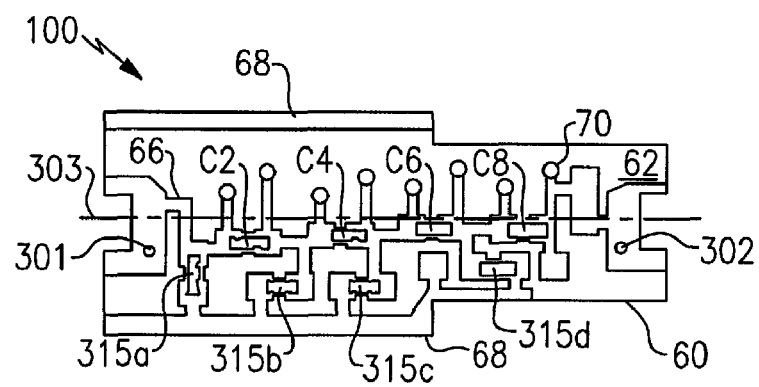
FIGS. 6A and 6B are top and bottom plan views, respectively, showing the physical positioning on opposite surfaces of a circuit board for the filter circuit shown schematically in FIG. 3.
Figure 6B:
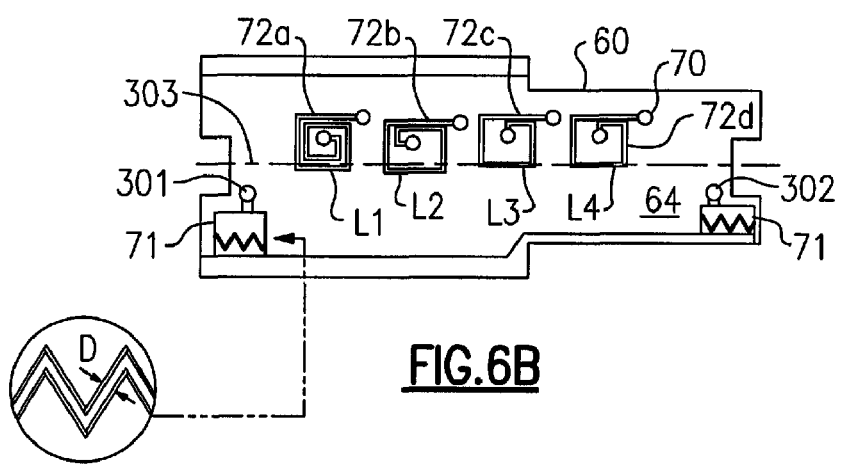

Referring now to FIGS. 6A and 6B of the drawings, the filter 100 includes the printed circuit board 60 having a first major surface 62 and a second major surface 64. The input terminal 301 and the output terminal 302 are provided at opposing ends of the circuit board 60 and extend along a centerline 303. The surface 62 is denoted as the top layer in FIG. 6A, and a second surface 64 is denoted as the bottom layer in FIG. 6B. The first surface 62 includes a signal path 66 joining the input terminal 301 to the output terminal 302. In the illustrated example, the signal path 66 is printed on the circuit board 60 using metallization and/or a etching process. The first surface 62 further includes a conductive ground path 68. In one embodiment, the ground path 68 is in electrical communication with a coaxial cable connector body (not shown). The connector body, in turn, is in electrical communication with the outer conductive layer of the coaxial cable 30, which is in electrical communication with the ground block 23. Shunt capacitor elements 316A-315d bridge the signal path 66 to ground. The first surface 62 further includes capacitor elements C2, C4, C6, and C8 as part of the resonator elements 310a-310d, respectively (FIG. 3). The capacitor elements C2, C4, C6, and C8 are arranged in parallel with the inductor elements L1-L4, respectively, by conductive vias 70 that extend through the circuit board substrate.

The exemplary printed circuit board 60 is formed from 0.8 millimeter FR-4 (woven glass and epoxy) with 1 ounce copper, double sided, but depending upon the dielectric requirements of the circuit the substrate may be other materials such as FR-2 (phenolic cotton paper), FR-3 (cotton paper and epoxy), FR-6 (matte glass and polyester), CEM-1 (cotton paper and epoxy), CEM-5 (woven glass and polyester), aluminum, or ceramic. The circuit board 60 is not limited to rigid substrate materials. In one embodiment, the circuit 100 is disposed on flexible circuit board material.

In the disclosed embodiment, the capacitor elements C1-C9 are the surface-mount variety; however, metalized or etched capacitors would function adequately and may even have benefits over the surface mount. The inventor has found the inductive properties of the etched capacitors to be beneficial in the resonance tuning of the circuit.

Turning now to FIG. 6B, the second surface 64 of the circuit board 60 includes spark gap arrestors 71 to protect the filter circuit 100 from excessive voltage. The illustrated spark gap arrestors 71 include a gap distance, denoted by D, of approximately 0.13 millimeters (mm) between the conductive portion of the signal path 66 and the ground path 68. The second surface 64 further includes a plurality of etched inductor elements 72 etched into the substrate of the circuit board 60. The disclosed inductor element 72 is a spiral etched inductor element, meaning a spiral inductor shape that is generally round, such as a circle, a rounded rectangle, an ellipse, a volute, and other generally circular forms. Referring to FIG. 7, an exemplary etched spiral inductor 72 includes a spiral conductive trace 74 etched into the printed circuit board 60. Each trace 74 may be monolithically deposited within the printed circuit board 60 by any common printed circuit board processing technique. For example, the trace 74 may be photo-etched into the printed circuit board 60. Photo-etching provides the capability to produce a trace 74 having a narrow width and small separation between traces.

Typical etched inductors found in the prior art cannot be tuned because the inductor geometry is fixed. This inflexibility may be problematic in a mass-production environment because manufacturing tolerances and variables such as changes to the circuit board substrate may alter the resonating characteristics of the inductor arrangement. For this reason, etched inductors are disfavored in many filter circuit applications. The inventor has overcome this obstacle by adding one or more tuning elements 76 to the illustrated etched inductor element 72. The tuning elements 76 are adapted to alter the length of the inductor trace 74, thereby changing the inductance of the inductor element 72. In the disclosed embodiment, a plurality of tuning elements 76a-76c comprise additional conductive traces etched into the circuit board substrate, bridging intermediate portions of an inner loop 75 to the via 70. One or more of the tuning elements 76 may be removed, for example by mechanical scraping, if the inductance value of the inductor element 72 requires adjustment. Conversely, tuning elements 76 may be added after filter fabrication by way of conductive strips.

The inductor element 72 may be arranged in geometries other than spiral, as long as the inductor length is sufficient to provide the resonant characteristics. For example, referring to FIG. 7B and FIG. 7C, the geometry may be formed in a successive "U" pattern or even a straight line such as a quarter wavelength element.

Figure 8:
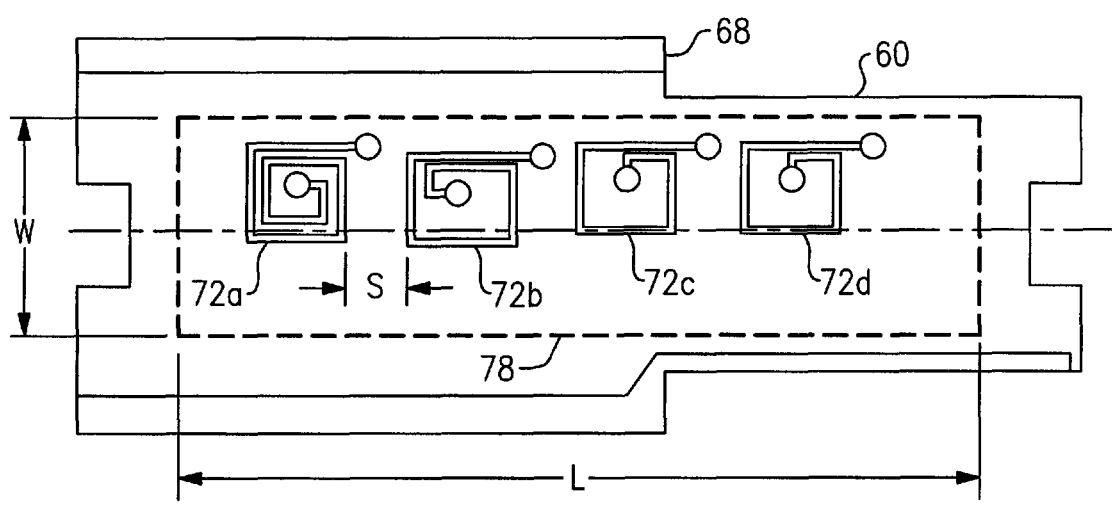
FIG. 8 is a bottom plan view of a circuit board according to one embodiment of the invention.

Referring to FIG. 8, the inductor elements 72 are arranged on the second surface 64 in a manner that takes advantage of their electromagnetic coupling characteristics. In prior art arrangements, inductor elements were typically spaced so as to minimize or eliminate electromagnetic coupling. That is, a filter designer would typically design the spiral inductor elements to achieve the desired inductance values, and then electrically isolate each inductor on the circuit board as much as possible from a neighboring inductor. Several common methods of electrically isolating the inductor elements include: spacing the inductor elements far apart, oppositely turning the electromagnetic fields, or adding decoupling elements and/or ground planes. In the present invention, however, the coupling between inductor elements is used advantageously to minimize the surface area on which the components are arranged. The arrangement of inductor elements 72 defines a footprint 78 within which the inductor elements 72a-72d fit.

Figure 7A:
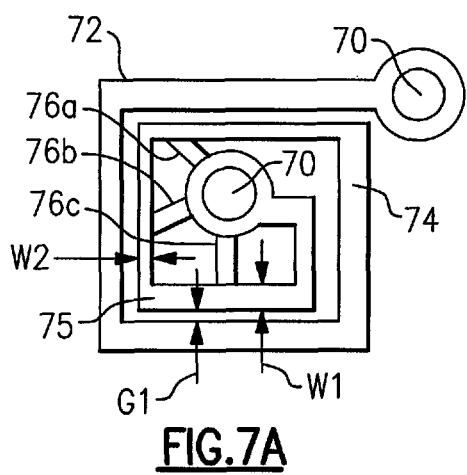
FIGS. 7A, 7B, and 7C are plan views of circuit elements shown in FIG. 6B.
Figure 7B:
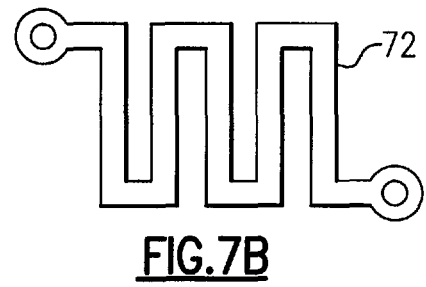
Figure 7C:
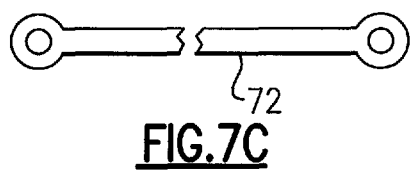

Referring now to FIGS. 7A and 8, the arrangement of the inductor elements 72 within the footprint 78 depends on many variables such as: the number of inductor elements, the desired frequency response of the filter, the distance or spacing S between the inductor elements, the direction of turn for neighboring inductor elements (clockwise or counterclockwise), the diameter (or length and width) of the inductor element, the width W of the inductor traces 74, the spacing G between traces 74, and the geometry of the inductor element, to name a few. In the disclosed embodiment, at least three inductor elements 72 are required to achieve the desired frequency response. In some examples, more than four inductor elements 72 may result in an adequate design. In one example, six inductor elements 72 provide sufficient frequency response. The distance S between inductor elements in one example may be in a range of 0.76 mm to 2.0 mm. In another example, the distance between inductor elements 72 may be in a range of 1.4 mm to 1.7 mm. In another example, the distance between inductor elements 72 may be in a range of 0.13 mm to 0.76 mm. The width W of the inductor trace 74 may be in a range of 0.02 mm to 0.25 mm in one example. In another example, the width W of the inductor trace 74 may be in a range of 0.076 mm to 0.203 mm. In yet another example, the width W of the inductor trace 74 may be in a range of 0.127 mm to 0.178 mm. The spacing G between traces 74 in one example may be in a range of 0.02 mm to 0.25 mm. In another example, the spacing G of the inductor trace 74 may be in a range of 0.051 mm to 0.127 mm. In yet another example, the spacing G of the inductor trace 74 may be in a range of 0.127 mm to 0.25 mm. The diameter (or length and width) of the inductor element 72 may be sized within the constraints of the particular application, but in one example the diameter is in the range of 1.0 mm to 6.4 mm. In another example, the diameter is in the range of 2.5 mm to 3.5 mm.

The arrangement of the inductor elements 72 defines the footprint 78 on the printed circuit board 60. The inventor has found that the removal of the decoupling elements allows close-coupling of the etched inductor elements 72 such that they may be arranged in a heretofore unknown smaller area. In the disclosed embodiment, the footprint 78 encompasses only the inductor elements 72 because the capacitor elements are arranged on the back side of the substrate. However, the inductor/capacitor resonator elements 310 may also be arranged on only a single surface of the substrate.

The inventor has also found that the individual quality factor (e.g., Q value) of each inductor 72 may not be of primary importance to the design of the filter circuit 100, contrary to the teachings of the prior art. The inventor has found that the close-coupling of the inductor elements 72 with the substrate material and capacitor elements 315 has a greater effect on the overall quality factor than the individual Q values. In other words, the close-coupling of the inductor elements 72 may compensate for less-than-ideal individual Q values. Filter designers may therefore spend less time trying to achieve high Q values for the individual inductors so long as the inductors are close-coupled.

The etched inductor elements 72 may be arranged within a footprint 78 small enough to be integrated with a variety of standard cable housings. In one embodiment, the housing is a standard cable connector body.

Figure 9:
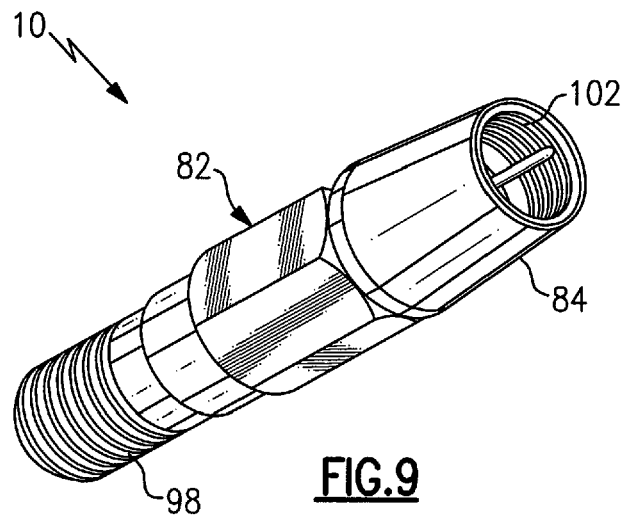
FIG. 9 is a perspective view of a coaxial cable connector with a filter circuit according to another embodiment of the invention.
Figure 10:
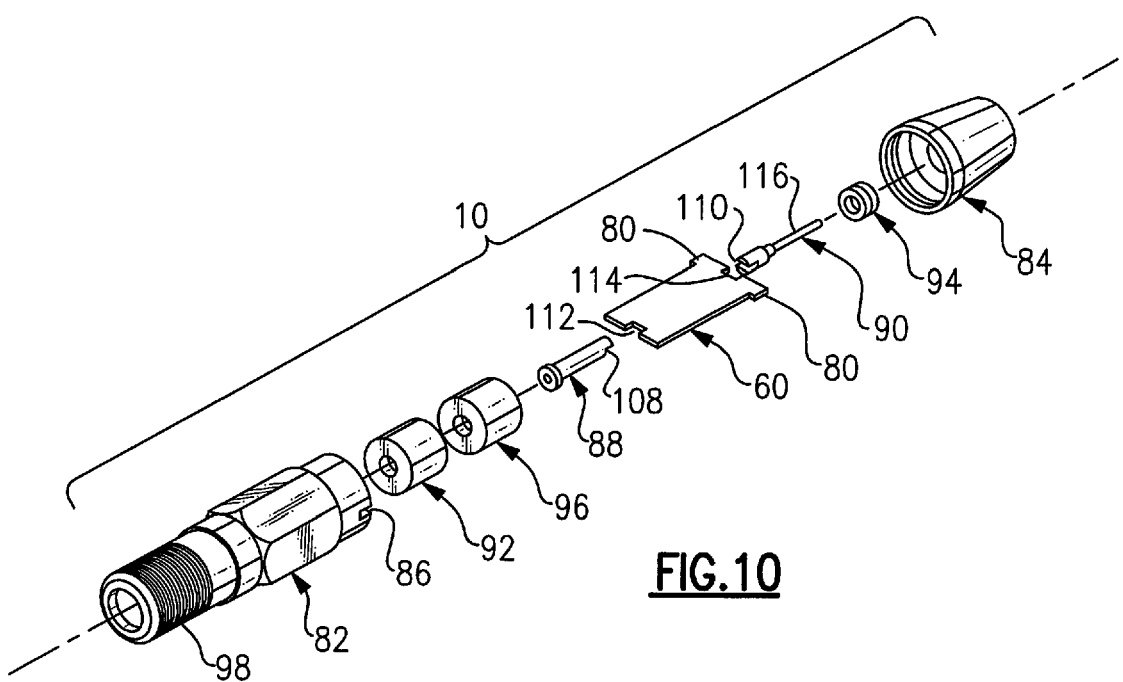
FIG. 10 is an exploded perspective view of the filter assembly for the coaxial cable connector shown in FIG. 9.
Figure 11:
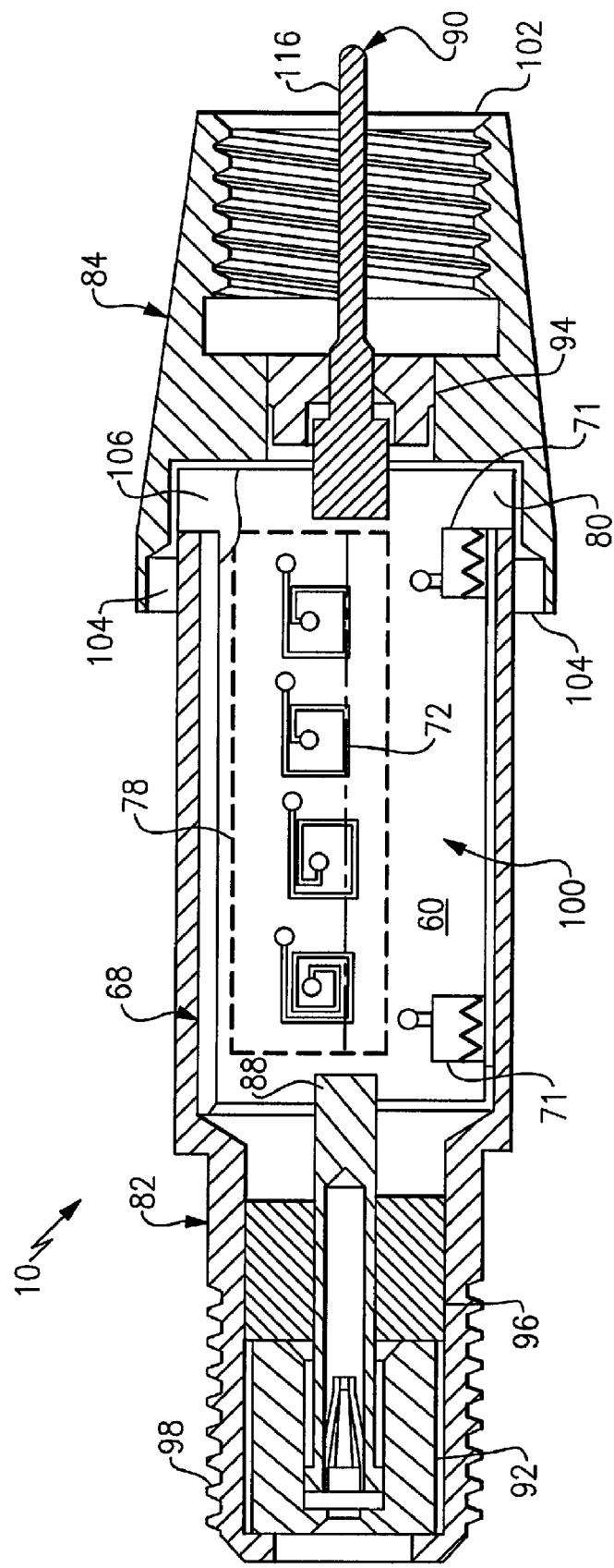
FIG. 11 is a side elevational view of the filter assembly of FIG. 9, in axial cross section.

Referring to FIGS. 9-11, a filter assembly 10 includes the printed circuit board 60 with the inductor elements 72 arranged within the footprint 78 so as to fit within a connector body 82. In the disclosed example, a filter assembly 10 includes the printed circuit board 60 having the filter circuit and a ground path 68, as shown in FIG. 11. The printed circuit board 60 has at least one tab 80. The exemplary printed circuit board 60 has two tabs 80 on opposite sides thereof. The housing of the filter 10 includes a body 82 and a nut 84. The body 82 includes means for aligning the printed circuit board 60 in the body. A variety of alignment means may be used. In one example, the body 82 has a respective slot 86 for receiving each of the at least one tab(s) 80 on the printed circuit board 60, thereby aligning the printed circuit board 60 with the body 82, before and during subsequent soldering. Alignment of the printed circuit board 60 ensures that the terminals 88 and 90 are aligned for proper mechanical fit within the insulators 92, 94 and elastomeric seal 96. The slots 86 provide mechanical support for the printed circuit board 60 and relieve the stress of the solder joints. The exemplary body 82 is formed from C36000 brass, (ASTM B16, ½ hard), but other materials may be used.

The body 82 is shaped so as to provide a first cable connector 98 at an end thereof. In the exemplary embodiment, body 82 has a male cable connector, but one of ordinary skill in the art can readily construct a body having a female connector thereon.

The nut 84 fits on an end of the body 82 opposite the cable connector 98 of the body. The nut 84 provides a second cable connector 102 at an end thereof opposite the first cable connector 98. Preferably, the connector 102 is of the opposite type from connector 98. For example, connector 98 is male, and connector 102 is female. The nut 84 is connected to the body 82 by solder 104 along a periphery of the nut to form a water tight seal. The exemplary nut 84 is formed from C36000 brass, (ASTM B16, ½ hard), but other materials may be used. Although the exemplary nut 84 has a conical shape, a variety of nut shapes may be used. For example, the nut may be cylindrical, conical, or may have two or more sections, each having a different shape (e.g. a cylindrical section and a conical section). Other shapes are also contemplated.

The ground plane 68 of the printed circuit board 60 is connected to an inner wall of the body 82 by solder 106. Preferably, the solder 106 joining the nut 84 to the body 82 flows into, and is continuous with, the solder 104 connecting the ground plane 68 to the body 82.

The pair of terminals 88 and 90 are electrically connected at opposite ends of the printed circuit board 60. Each of the terminals 88 and 90 has a slot (108 and 110, respectively) sized to receive a respective end (112 and 114, respectively) of the printed circuit board 60. Preferably, the slot is used to form a friction fit between the printed circuit board and the terminals during assembly. The terminals are then soldered to the printed circuit board 60. The ends 112 and 114 of the printed circuit board 60 have electrical contact pads thereon, for forming electrical contact with the terminals 88 and 90. When assembled, the terminals 88 and 90 are in line with the printed circuit board 60. That is, the longitudinal axis of each terminal 88, 90 passes through a central longitudinal axis of the printed circuit board 60. The central longitudinal axis of the printed circuit board 60 is centrally located with respect to both the width and thickness of the printed circuit board.

One of the terminals 90 is a male terminal having a pin 116 extending away from the printed circuit board 60. The other terminal 88 is a female terminal capable of receiving a cylindrical pin. The pin may be, for example, of the size and shape of pin 116, and the pin may belong to either a cable connector or another filter having a connector end similar to connector 102. The terminals 88 and 90 may, for example be formed from C36000 brass, ASTM B16, ½ hard, with the contacts of terminal 88 formed from beryllium copper alloy.

The filter assembly 10 has an insulator 92, an elastomeric seal 96 at the end of the body 82 having the first connector 98. The insulator 92 may be formed of a polymer, such as natural TPX RT-18. The elastomeric seal 96 creates a water-tight seal between the body 82 and the terminal 88. The seal 96 may be formed of rubber, silicone, or other compressible insulating material. The exemplary seal 96 is formed from 30-40 durometer silicone rubber.

The insulator 94 that is provided at the end of the nut 84 having the second connector 102 creates a water-tight seal between the nut 84 and the terminal 90. Insulator 94 may be formed of a polymer, such as polypropylene.

The exemplary housing 82 may have several sizes, depending upon the particular needs of the application. In one example, the housing 82 is approximately 19 mm (0.75 inches) in diameter. With reference to FIG. 8, the footprint 78 may therefore include a width W of approximately 17.8 mm and a length L of approximately 30.5 mm, resulting in the footprint 78 having an area of approximately 540 mm².

Although not shown in the drawings, the printed circuit board 60 may be a circular wafer shape, and fit within the hollow circumferential cavity defined by the interior of the connector body 82. This configuration results in a much shorter connector length. The footprint 78 in this example is approximately $$\frac{\pi(17.8)^2}{4},$$

or 250 mm².

In another example, the housing 82 is approximately 7.2 mm (0.285 inches) in diameter. Accordingly, the footprint 78 may therefore include a width W of approximately 6.2 mm and a length L of approximately 30.5 mm, resulting in the footprint 78 having an area of 190 mm².

Figure 12:
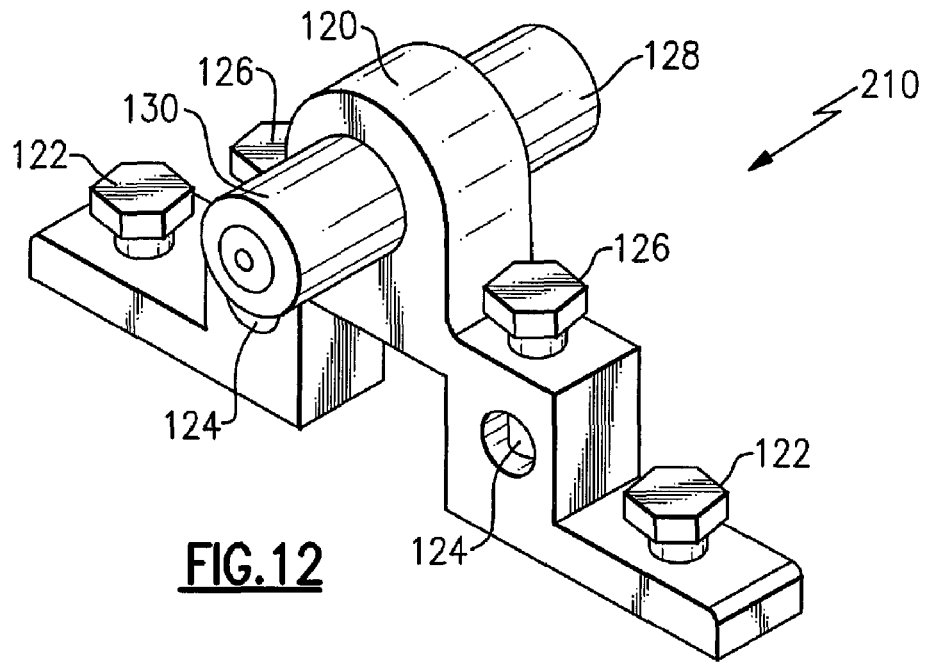
FIG. 12 is a perspective view of a ground block with a filter circuit according to another embodiment of the invention.

Referring to FIGS. 1 and 12, in another embodiment of the invention, the standard cable housing to which the filter circuit is integrated is the ground block 23. A filter assembly 210 adapted for use in the ground block 23 according to the present invention includes a housing 120. The housing 120 is secured to the premises 24 by one or more fasteners 122. The housing 120 defines a thru bore 124 into which a ground wire (not shown) is secured by a grounding lug 126. The housing 120 further includes a first connector 128 adapted to receive the drop cable 22. A second connector 130 is adapted to connect to the coaxial cable 30 for the premises.

Figure 13:
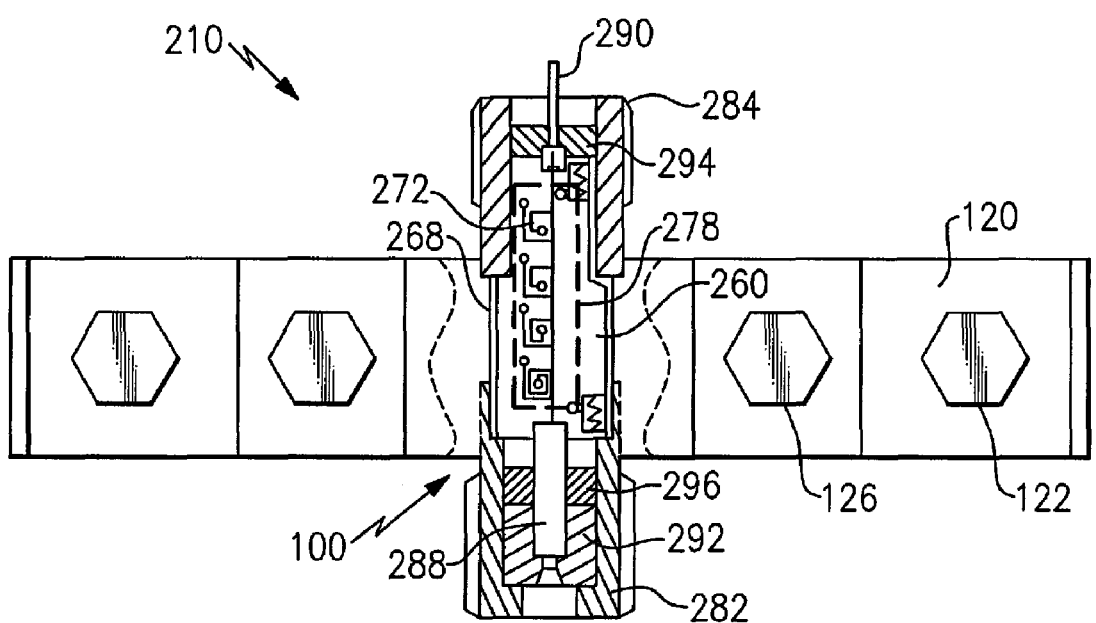
FIG. 13 is a top plan view of the filter assembly for the ground block shown in FIG. 12, in cross section.

Turning now to FIG. 13, wherein like numerals indicate like elements from FIG. 11, the filter assembly 210 further includes filter circuit 100, essentially as described in previous embodiments. That is, inductor elements 272 are arranged on a printed circuit board 260 to define a footprint 278. In this embodiment, a ground plane 268 on the circuit board 260 is in electrical communication with the housing 120. The filter circuit 100 is sealed and protected from weather and environmental elements. A first connector body 284 secures and encapsulates the circuit board 260. The body 284 may be threaded to the housing 120, welded, or interference fit. An insulator 294 is provided to create a water-tight seal between the body 284 and a terminal 290. Insulator 294 may be formed of a polymer, such as polypropylene. A second connector body 282 similarly mates with the housing 120. The body 282 encapsulates an insulator 292 and an elastomeric seal 296. The insulator 292 may be formed of a polymer, such as natural TPX RT-18. The elastomeric seal 296 creates a water-tight seal between the body 282 and a terminal 288. The seal 296 may be formed of rubber, silicone, or other compressible insulating material. The exemplary seal 296 is formed from 30-40 durometer silicone rubber.

The filter assembly 210 adapted for use as the ground block 23 may comprise alternate configurations. Although not shown in the drawings, the filter assembly 210 including the filter circuit 100 may include surface-mounted capacitors and inductors on the printed circuit board 260.

The inventor has found that the ground block location is preferred for the low pass filter of the present invention. Signals travelling on the personal data bandwidth (e.g., 1125 MHz to 1525 MHz) travel unobstructed throughout the premises 24, but are attenuated at the ground block location before they may travel to the tap port 18.

In another embodiment, the standard cable housing to which the filter circuit 100 is integrated is a splitter housing, such as the splitter 26 illustrated in FIG. 1. The filter circuit 100 of the present invention may be a stand-alone circuit, or may be branched with other filter circuitry within the splitter.

In yet another embodiment, the standard cable housing to which the filter circuit 100 is integrated is a drop amplifier housing (not shown). Alternately, the filter circuit 100 may be integrated with the drop amplifier and the ground block into a single housing.

Figure 14A:
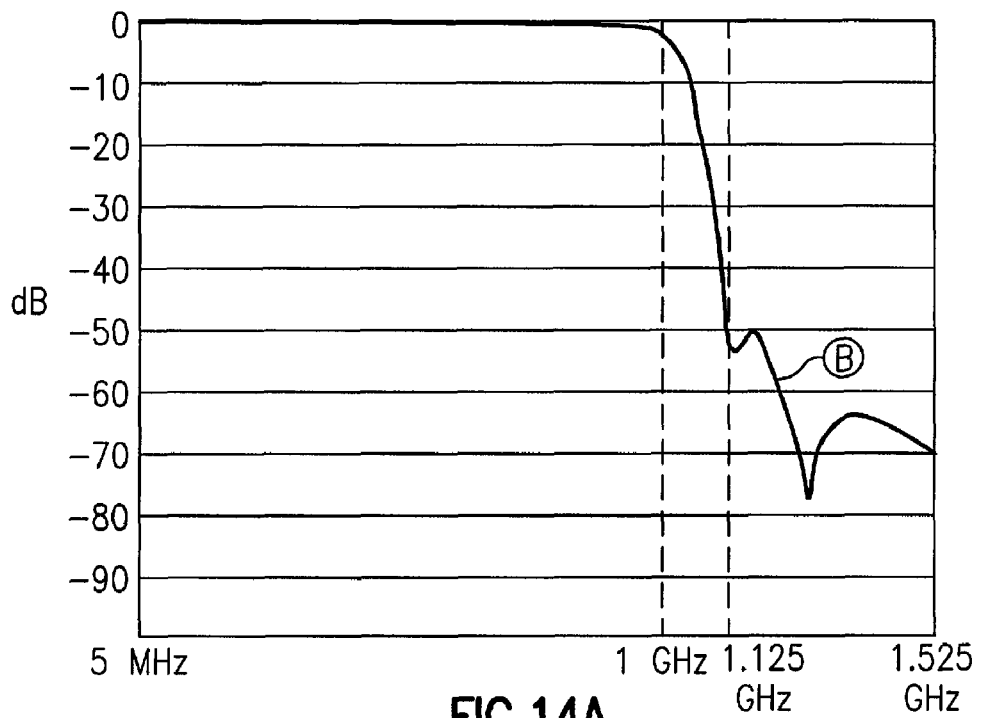
FIGS. 14A and 14B are charts showing the insertion loss and return loss, respectively, of the filter circuit of FIGS. 6A and 6B.
Figure 14B:
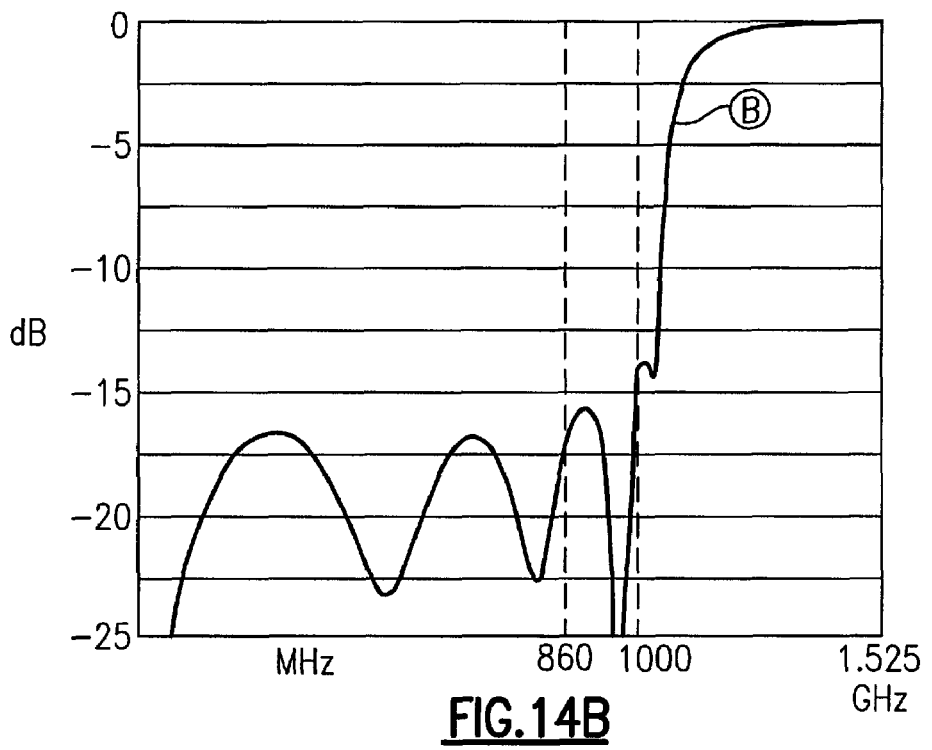

The close-coupled arrangement of inductor elements not only provides a small enough footprint to allow usage in housings that were previously too limiting, but also provides a superior signal response. Referring to FIGS. 14A and 14B, trace B is the insertion loss and return loss, respectively, for one example filter circuit 100 of the present invention. The filter circuit 100 causes an insertion loss of less than 3 dB up to 1000 MHz, and the attenuated portion causes more than 50 dB loss at frequencies greater than 1125 MHz. The minimum return loss is 15 dB up to 1002 MHz, and further refinements are expected to improve the minimum return loss to 20 dB.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims. For example, the disclosed filter circuit may be incorporated into other circuit form factors, either by applying the circuit to additional circuit board layers or combining the filter circuit with a more complex circuit on a single layer.

I claim:

1. A filter circuit assembly comprising:
 a printed circuit board having first and second opposed major surfaces and first and second opposing sides, the opposed major surfaces being substantially parallel to a single plane and being bisected by a longitudinal axis, the first and second opposing sides being substantially parallel to the longitudinal axis;
 an input terminal connected to the printed circuit board, the input terminal having an axis extending substantially parallel to the longitudinal axis;
 an output terminal connected to the printed circuit board, the output terminal having an axis extending substantially parallel to the longitudinal axis;
 a signal path disposed on the printed circuit board, the signal path extending from the input terminal toward the output terminal;
 a plurality of resonator elements being fabricated upon at least one of the major surfaces, the resonator elements arranged in series along the signal path and defining a footprint being less than 540 square millimeters; and
 wherein the filter passes a first range of frequencies in a provider bandwidth and attenuates a second range of frequencies in a personal data network bandwidth.

2. The filter circuit assembly of claim 1, wherein the first range of frequencies in the provider bandwidth is between 5 megahertz and 1002 megahertz, and the second range of frequencies in the personal data network bandwidth is between 1125 megahertz and 1525 megahertz.

3. The filter circuit assembly of claim 1, wherein the filter has an insertion loss characteristic of more than 30 decibels in the personal data network bandwidth.

4. The filter circuit assembly of claim 1, wherein the filter has an insertion loss of less than 3 decibels in the provider bandwidth.

5. The filter circuit assembly of claim 1, further comprising a spark gap element disposed on one of the major opposing surfaces.

6. The filter circuit assembly of claim 1 wherein the footprint is less than 250 square millimeters.

7. The filter circuit assembly of claim 6 wherein the footprint is less than 190 square millimeters.

8. The filter circuit assembly of claim 1 wherein the resonator elements comprise parallel inductor and capacitor elements.

9. The filter circuit assembly of claim 8 wherein the inductor elements are disposed on one major surface and the capacitor elements are disposed on another major surface, the inductor elements and capacitor elements being in electrical communication by a via.

10. The filter circuit assembly of claim 8 further comprising a tuning element bridging an intermediate portion of at least one of the inductor elements to the signal path.

11. The filter circuit assembly of claim 8 wherein the inductor elements are spiral etched inductor elements.

12. The filter circuit assembly of claim 11 further comprising a tuning element bridging an intermediate portion of at least one of the spiral etched inductor elements to a via.

13. A filter circuit having a frequency response, the frequency response comprising:
 a signal path extending from an input to an output and having a conductor and a ground;
 a pass portion having a first frequency spectrum in a provider bandwidth;
 an attenuated portion having a second frequency spectrum in a personal data network bandwidth, the attenuated portion causing a uniform insertion loss of greater than 30 decibels;
 a transition portion between the low pass portion and the attenuated portion; and
 wherein a topology of the filter circuit comprises a first plurality of resonator elements arranged in series along the signal path, and a second plurality of shunt capacitor elements disposed between the resonator elements, the second plurality of shunt capacitor elements in electrical communication with the ground.

14. The filter circuit of claim 13 wherein the frequency range in the provider bandwidth is 5 megahertz to 1002 megahertz.

15. The filter circuit of claim 13 wherein the attenuated portion causes a uniform insertion loss of greater than 50 decibels.

16. The filter circuit of claim 13 wherein the resonator elements comprise parallel inductor elements and capacitor elements.

17. The filter circuit of claim 13 wherein the transition portion has a frequency range of less than 150 megahertz.

18. The filter circuit of claim 13 wherein the range of frequencies in the personal data network bandwidth is 1125 megahertz to 1525 megahertz.

19. The filter circuit of claim 18 wherein the frequency range in the personal data network bandwidth is greater than 1125 megahertz and less than 1525 megahertz.

20. The filter circuit of claim 19 wherein the attenuated portion causing a uniform insertion loss of greater than 40 decibels.

21. The filter circuit of claim 13 wherein the topology is an elliptic filter.

22. The filter circuit of claim 21 wherein the elliptic filter is a Chebyshev elliptic filter.

23. The filter circuit of claim 22 wherein the elliptic filter is a ninth order Chebyshev elliptic filter.

24. A filter circuit assembly for use in television provider services, the circuit assembly comprising:
 a printed circuit board having first and second opposed major surfaces and first and second opposing sides, the opposed major surfaces being substantially parallel to a single plane and being bisected by a longitudinal axis, the first and second opposing sides being substantially parallel to the longitudinal axis, the printed circuit board being comprised of a substrate having dielectric properties;
 a signal path disposed on the substrate, the signal path extending from an input port toward an output port;
 at least three etched spiral inductor elements fabricated upon the first opposed major surface and arranged in series along the signal path, the arrangement of the inductor elements defining a footprint, the footprint being less than 250 square millimeters;
 a plurality of capacitor elements in electrical communication with the etched inductor elements to form a plurality of resonator elements, the capacitor elements being fabricated upon the second opposed major surface and being connected to the inductor elements by a via; and wherein the filter passes a first range of frequencies between 5 megahertz and 1002 megahertz and attenuates a second range of frequencies between 1125 megahertz and 1525 megahertz, the second range of frequencies having an insertion loss of more than 30 decibels.

25. The filter circuit assembly of claim 24 wherein the footprint is less than 190 square millimeters.

26. The filter circuit assembly of claim 24 wherein the inductor element comprises a conductive trace, the filter further comprising a tuning element bridging intermediate portions of the conductive trace to the via.

27. The filter circuit assembly of claim 26 wherein the tuning element is a conductive trace etched into the opposed major surface.

28. A coaxial cable ground block assembly comprising:
a housing having a thru bore, the housing adapted for electrical contact with a source to electrical ground;
a first connector body coupled to one end of the thru bore of the housing;
a first coaxial cable terminal coupled to the first connector body;
a second connector body coupled to the other end of the thru bore of the housing;
a second coaxial cable terminal coupled to the second connector body; and
a printed circuit board sealed within the housing, the circuit board having an input in electrical contact with the first terminal, an output in electrical contact with the second terminal, a ground plane in electrical contact with the housing, a signal path extending from the input toward the output, and a filter circuit disposed on the signal path, the filter circuit passing a provider bandwidth and attenuating a personal data network bandwidth.

29. The ground block assembly of claim 28 wherein the filter circuit comprises a plurality of resonator elements arranged in series along the signal path.

30. The connector assembly of claim 29 wherein the resonator elements comprise parallel inductor and capacitor elements, the inductor elements comprising spiral etched inductor elements.

31. The ground block assembly of claim 29 wherein the resonator elements define a footprint being less than 540 square millimeters.

32. The connector assembly of claim 31 wherein the footprint is less than 250 square millimeters.

33. The connector assembly of claim 32 wherein the footprint is less than 190 square millimeters.

34. A coaxial cable connector assembly comprising:
a printed circuit board having a signal path and a ground plane thereon, the printed circuit board having first and second opposed major surfaces and first and second opposing sides, the opposed major surfaces being substantially parallel to a single plane and being bisected by a longitudinal axis, the first and second opposing sides being substantially parallel to the longitudinal axis, the signal path having an input, an output, and a filter circuit disposed therebetween, the filter circuit passing a provider bandwidth and attenuating a personal data network bandwidth, the filter circuit having a plurality of resonator elements arranged in series along the signal path and defining a footprint being less than 540 square millimeters;
a body that receives the printed circuit board, the body having a first end and a second end opposite the first end, the first end and second end shaped so as to receive a first cable connector and a second cable connector respectively;
a first terminal disposed within the body in electrical contact with the input of the signal path;
a second terminal disposed within the body in electrical contact with the output of the signal path;
a first insulator disposed in surrounding relation to the first terminal;
a second insulator disposed in surrounding relation to the second terminal; and
at least one seal located entirely within the body to protect the circuit board from environmental elements.

35. The connector assembly of claim 34 wherein the filter circuit has an insertion loss characteristic of more than 30 decibels in the personal data network bandwidth.

36. The connector assembly of claim 34 wherein the resonator elements comprise parallel inductor and capacitor elements, the inductor elements comprising spiral etched inductor elements.

37. The connector assembly of claim 34 wherein the footprint is less than 250 square millimeters.

38. The connector assembly of claim 37 wherein the footprint is less than 190 square millimeters.

* * * * *

UNITED STATES PATENT AND TRADEMARK OFFICE
CERTIFICATE OF CORRECTION

PATENT NO.        : 8,125,299 B2
APPLICATION NO.   : 12/501041
DATED             : February 28, 2012
INVENTOR(S)       : Erdogan Alkan It is certified that error appears in the above-identified patent and that said Letters Patent is hereby corrected as shown below:

In Column 3, line 11, after "best" please delete "be"

In Column 6, line 30, after "shunts" please delete "316A" and insert -- 315a --

In Column 6, line 33, after "shunts" please delete "316B" and insert -- 315b --

In Column 8, line 15, after "elements" please delete "316A-315d" and insert -- 315a-315e --

Signed and Sealed this
Twenty-fifth Day of September, 2012

David J. Kappos
*Director of the United States Patent and Trademark Office*